United States Patent [19]

Tsuji

[11] Patent Number: 4,544,540

[45] Date of Patent: Oct. 1, 1985

[54] DIAMOND SINGLE CRYSTALS, A PROCESS OF MANUFACTURING AND TOOLS FOR USING SAME

[75] Inventor: Kazuo Tsuji, Hyogo, Japan

[73] Assignee: Sumitomo Electric Industries, Ltd., Osaka, Japan

[21] Appl. No.: 506,935

[22] Filed: Jun. 22, 1983

[30] Foreign Application Priority Data

Jun. 25, 1982 [JP] Japan .................................. 57-110398
Aug. 13, 1982 [JP] Japan .................................. 57-141505

[51] Int. Cl.$^4$ .............................................. C01B 31/06
[52] U.S. Cl. ............................. 423/446; 156/DIG. 68
[58] Field of Search ................. 423/446; 156/DIG. 68

[56] References Cited

U.S. PATENT DOCUMENTS

| | | | |
|---|---|---|---|
| 3,297,407 | 1/1967 | Wentorf | 423/446 |
| 3,423,177 | 1/1969 | Bovenkerk | 423/446 |
| 4,036,937 | 7/1977 | Roy et al. | 423/446 |
| 4,122,636 | 10/1978 | Roy et al. | 423/446 |
| 4,287,168 | 9/1981 | Wentorf et al. | 423/446 |
| 4,322,396 | 3/1982 | Strong | 423/446 |
| 4,333,986 | 6/1982 | Tsuji et al. | 423/446 |
| 4,412,980 | 11/1983 | Tsuji et al. | 423/446 |
| 4,425,315 | 1/1984 | Tsuji et al. | 423/446 |

FOREIGN PATENT DOCUMENTS

| | | | |
|---|---|---|---|
| 0014589 | 8/1980 | European Pat. Off. | 423/446 |
| 58-26017 | 2/1983 | Japan | 423/446 |

Primary Examiner—William R. Dixon, Jr.
Assistant Examiner—Steven Capella
Attorney, Agent, or Firm—Sughrue, Mion, Zinn, Macpeak, and Seas

[57] ABSTRACT

An artificial diamond single crystal, a process for producing it, and tools for utilizing it are disclosed. The artificial diamond crystal has at least one surface which has a rough surface formed by suppressed crystal growth at that surface. The single crystal is produced by providing a diamond synthesis reaction system comprised of a reaction chamber, a carbon source and a solvent metal arranged in contact with the carbon source. A seed crystal is provided in the reaction chamber under elevated pressures and temperatures which permit diamond to be maintained thermodynamically stable. The reaction system is heated to provide a temperature gradient in such a way that a portion of the solvent metal in contact with the carbon source is higher in temperature than a portion of the solvent metal in contact with the seed crystal. This temperature gradient causes a migration of the carbon from the higher temperature portion to the lower temperature portion using the solvent metal as a medium. This allows the carbon to precipitate and grow as diamond on the seed crystal due to the difference in solubility caused by the temperature gradient. The conditions in the reaction chamber housing are maintained so as to suppress crystal growth in at least one direction perpendicular to the direction of the temperature gradient, at the end of the solvent metal. The suppressed crystal growth provides the rough surface of the single crystal which can be connected to a tool and thus provides good adherence between the crystal and the tool.

11 Claims, 21 Drawing Figures

DIAMOND SINGLE CRYSTALS, A PROCESS OF MANUFACTURING AND TOOLS FOR USING SAME

FIELD OF THE INVENTION

The present invention relates to artificial diamond single crystals having a rough surface which are suitable for use in tools, and a process for manufacturing such crystals.

BACKGROUND OF THE INVENTION

Bits for drilling rocks and tip material of dressers for repairing grinding wheels have been made of diamond which has the highest hardness of all materials. Diamonds used in these tools must be approximately 1 mm or more in size. Natural diamond called "boart" is used at present since synthetic diamonds having such a size have not been manufactured on an industrial scale.

The resistance to wear of a diamond varies to a great extent depending upon the orientation of crystals and it is essential in the use of these tools to select a proper orientation. On the other hand, natural diamonds are scarcely idiomorphic because of their being subjected to dissolution in the process of growth. Generally, natural diamonds have been rounded, and have a variety of shapes depending upon the degree of dissolution. As a result, it requires considerable skill to determine the proper orientation of crystals which can serve as tools.

SUMMARY OF THE INVENTION

An object of the present invention is to increase the adhesive strength of a diamond single crystal to a tool support by providing the crystal with a novel surface condition.

Another object of the present invention is to provide a diamond single crystal having a shape suited for tools.

Another object of the present invention is to provide a rodlike diamond single crystal having a sufficient length for use in a tool.

The artificial diamond single crystal of the present invention is characterized in that at least a part of the surface of the crystal has a rough surface which was formed by suppressed crystal growth at that surface.

The diamond single crystal of the present invention is formed by the following method.

The disclosed process for manufacturing a diamond single crystal involves a diamond reaction system consisting of a carbon source, a solvent metal (molten catalyst metal) arranged in contact with said carbon source, and a seed crystal. The reaction system is held under elevated pressures and temperatures which permit diamond to be maintained in thermodynamically stable condition. The reaction chamber housing the reaction system is heated to provide a temperature gradient in such a way that the portion of the solvent metal in contact with the carbon source is higher in temperature than the portion of the solvent metal in contact with the seed crystal so as to migrate the carbon from the higher temperature portion to the lower temperature portion using the solvent metal as a medium. Accordingly, the carbon being precipitated and grown as diamond on the seed crystal due to the difference in solubility of carbon caused by said temperature gradient. The diamond single crystal of this invention is manufactured under the condition of that the crystal growth in at least one direction perpendicular to the direction of the temperature gradient (i.e., to the longitudinal direction) is suppressed at the end of the solvent metal. In the present invention the crystal growth suppression is carried out by using a solvent metal having a shape of the cross section perpendicular to the direction of the temperature gradient such that the crystal growth in the direction of the cross section plane suppressed at the solvent metal surface (the outer surface) due to insufficient size of the solvent metal in this direction.

DETAILED DESCRIPTION OF THE INVENTION

Figure 14:
FIG. 14 is a perspective view of a natural diamond.
Figure 15:
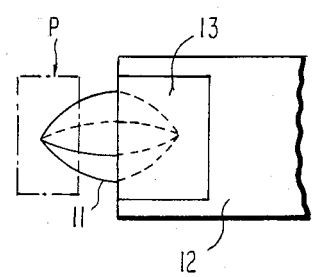
FIG. 15 is a cross-sectional view of the conventional dresser using a diamond shown in FIG. 14.

Generally, a natural diamond has a diameter almost equal to its length as shown in FIG. 14, with its entire configuration close to that of a sphere. In addition, the surfaces are smooth, and the edges which serve as knives when used in tools are rounded because it has been subjected to dissolution in the process of growth as described hereinabove. For this reason, when a natural diamond is used in a dresser a particular type of diamond tools nearly half of it is embedded in the cementing material on its support as shown in FIG. 15, so that the usable portion becomes very small (only the tip portion p in FIG. 15 can be used). Furthermore, since the surfaces are smooth as described above, the adhering strength to the cementing material is weak. Accordingly, it may fall off during use. In FIG. 15, reference numerals 11, 12, and 13 designate a natural diamond, a support, and a cementing material, respectively.

Further, in diamond bits used for drilling, there exists a problem that the bits lose their sharpness with progressing wear, resulting in increase of weight on bit. In addition, the adhering strength of the diamonds to the bit body is weak because only about half of each diamond is embedded in the bit body due to its nearly spherical shape, the surfaces are comparatively smooth, and because they are mounted to the bit body by powder metal method they are apt to fall of during drilling.

The present invention provides diamond dressers and bits which solve the problems encountered with the conventional ones by using the synthetic diamonds of the present invention therein.

The diamond single crystal of the present invention, the process for manufacturing them, and the diamond tools using them will be described below with reference to the accompanying drawings.

Figure 1:
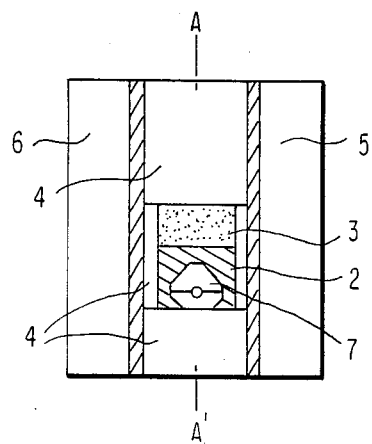
FIG. 1 is a longitudinal sectional view showing the conventional diamond forming arrangement used in the synthesis of an idiomorphic large diamond.

FIG. 1 shows an arrangement for manufacturing an idiomorphic large diamond single crystal by a known process. Components including a diamond seed crystal 1, a solvent metal 2, and a carbon source 3 are arranged in layers in a cylindrical heater 5 interposing a pressure medium of, for example, sodium chloride between the heater and the components. In this case, in order to use the temperature gradient naturally formed in the arrangement in the axial direction (A—A'), the carbon source is arranged at the portion of the higher temperature, generally, at the central portion (in the direction of the axis A—A') and the seed crystal at the portion of the lower temperature in this arrangement, generally, at the portion apart from the center. These are arranged in a pressure medium cylinder made of, for example, pyrophyllite, etc., which is housed in a superhigh pressure and temperature device. After being pressurized up to a predetermined pressure, they are heated by the heater 5.

Then, a temperature difference occurs between the carbon source and the seed crystal due to heat conduction at ends of the arrangement, causing carbon atoms to be migrated from the carbon source to the seed crystal to become a diamond and grow on the seed crystal. The growing diamond 7 continues to grow holding the same orientation as that of the face of seed crystal in contact with the solvent metal. That is, if the face of seed crystal is the face having index of a plan (100), the top face of growing diamond 7 is (100), and if the face of the seed crystal is (111) the top face is (111) (conventional methods are disclosed in, for example, *The Journal of Physical Chemistry*, Vol. 76, No. 12, 1971, pp 1833–1837).

Usually, in such a known manufacturing process, a solvent metal having a diameter larger than that of the growing diamond is used, so that an idiomorphic diamond having smooth surfaces may be obtained. This invention has been derived from the finding that, if the diameter of solvent metal is limited to less than the size of the idiomorphic diamond crystal which could be obtained at those conditions, i.e., the pressure, temperature and the carbon concentration in the metal, the diamond obtained has the same outside profile as that of the solvent metal, and has outer surfaces presenting a novel and industrially useful surface condition. In other words, if the growth of the diamond crystal is suppressed due to the insufficient size of the solvent metal in the direction perpendicular to the direction of the temperature gradient (the direction of axis A—A') a rough surface with irregularities forms at the portion where the crystal growth is suppressed. Therefore, to obtain rough surface at least at a part of the surface of the diamond it is necessary to make at least a part of the diamond crystal grow until the crystal reaches the end portion (side surface) of the solvent metal in the direction perpendicular to the axis A—A'. Thus the crystal growth is suppressed and a rough surface forms at that portion.

It is difficult to express the irregular state of the rough surface quantitatively, but it may be defined optically as an irregular state by which light is diffusibly reflected. The surface has a surface texture having a macro projection value (by ASTM) of not more than about 0.5 mm, usually, not more than 0.1 mm.

The shape of the diamond single crystal of the present invention is not limited to a special shape. The diamond may have a variety of cross sections in the direction perpendicular to the axis A—A', such as circle, a polygon, such as triangle, tetragon, or special form including star-shape, etc. as shown in FIGS. 10 to 13. The polygonal cross section may be such that at least one of angles forms a circular arc. It is preferable that the length l (in the direction of the axis A—A') is longer than the diameter of the cross section D, more preferably l ≧ 1.5 D. As the diameter D in the cases of FIGS. 11 to 13, the diameters for circles converted from the cross section area are used, which is referred to as "equivalent diameter" and can be calculated by the following equation:

$$D = \sqrt{\frac{4}{\pi} S}$$

where S=cross-sectional area.

(Hereinafter "equivalent diameter" refers to both "diameter" and "equivalent diameter".)

For obtaining a diamond crystal having a predetermined shape, for example, as shown in FIGS. 10, 11, 12 or 13, solvent metal having the same shape of the cross section as that of the aimed, predetermined shape is used. In such a case a seed crystal should be put at the center of the cross section of the end of the solvent metal where it contacts with the seed crystal.

For forming a diamond crystal having a rough surface only at a part of the side surface of the crystal, a solvent metal having a shape such that the crystal growth is suppressed only at a part of the side surface of the crystal is used, or the seed is placed at a position other than or apart from the center.

Figure 2:
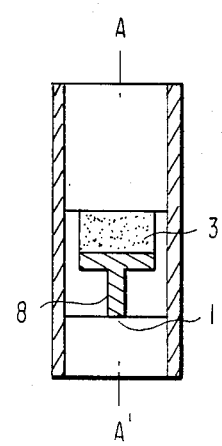
FIGS. 2 and 3 are longitudinal sectional views showing an embodiment of the arrangement used in the synthesis of a rodlike diamond according to this invention.
Figure 3:
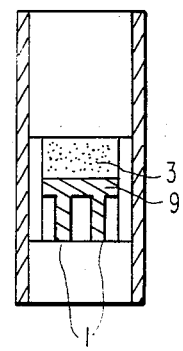

Generally, the solvent metal has a rodlike shape as shown in FIGS. 2 and 3. The length in the direction of the axis is not limited. In order to produce a sufficient concentration of carbon in the metal solvent it is preferred to provide a plate of the metal generally in the shape of a disk, which has a larger cross sectional area (in the direction perpendicular to the axis A—A') than that of the rodlike portion ("leg") at the end (top of FIGS.) of the rodlike solvent metal so that it contacts with the carbon source. The ratio of the equivalent diameter of the plate to the equivalent diameter of the rodlike solvent metal is more than 1, preferably from 2 to 5, and the ratio of the equivalent diameter of the plate to the thickness of the plate is usually 2 to 7. Since the contact area of the solvent metal with the carbon source can be made to be wider than that of the end area of the rodlike solvent metal the amount of carbon dissolved into the metal from the source is greater than that of the solvent metal having no such plate.

To manufacture diamond of the present invention, it is important to select the diameter of solvent metal. That is, a solvent metal having a comparatively large equivalent diameter may be used when the diamond growing rate is high. However, when the growing rate is low, it is necessary to reduce the equivalent diameter depending upon the growing rate.

The use of a solvent metal having an equivalent diameter which is too large would cause growth of an idiomorphic diamond with smooth surfaces which does not have the same cross-sectional shape as that of the solvent metal, and a rodlike crystal can not be obtained. There exists a proper equivalent diameter corresponding to a growing rate.

Usually, when the growing rate exceeds 5 mg/H, the diamond synthesized includes a great quantity of solvent metal as impurities, which may cause cracks in the diamond attached to the tool support or during operation. For this reason, a growing rate not more than 5 mg/H is preferable. Experiments have indicated that the equivalent diameter of solvent metal to be used in the synthesis should be approximately 4 mm or less. Further experiments have indicated that a diameter no more than 3 mm is proper for a growing rate of 1 to 3 mg/H, and a diameter no more than 4 mm is preferable for a growing rate of more than 3 and up to 5 mg/H.

The solvent metals used include known materials such as Fe, Ni, Co and alloys consisting principally of them. Useful alloy elements include Cr, Mn, Al, Ti, Zr, B, etc.

As the carbon source for the synthesis of diamond (3 in Figs.), known sources such as powder of pure graphite, diamond or a mixlture thereof are used.

The conditions for growth of the crystal may be the same as in a conventional method.

The requirements for the synthesis of diamond are that both the seed crystal portion and carbon source are under pressures and temperatures which permit diamond to be stable and that they are at temperatures at which the metal is able to be in a molten state and which is not less than the eutectic temperature for the solvent metal and carbon used. Good results may be obtained when the temperature difference between the seed crystal portion and the carbon source is kept in the range of 10° C. to 50° C.

The heating temperature is usually from about 1300° to 1600° C., and preferably 1400° to 1500° C., and the pressure is usually from 45 to 65 kb, and preferably 50 to 60 kb. These conditions are maintained until the crystal grows to the predetermined shape. The period of time for growth is generally about 10 to 100 hours. After the crystal growth to the predetermined shape the heating is stopped, the reaction system was cooled to about lower than 500° C., and then the pressure is released. The crystal is then taken out of the arrangement. The position of the seed crystal at the position contacting with the solvent metal is optional so long as at least a part of the crystal can grow until it reaches the side surface (in FIGS. 2 and 3 parallel to the axis A—A') of the solvent metal. Generally, the seed crystal is placed at the center of the cross sectional area of the solvent metal at the contacting position to obtain a crystal of which all side surfaces have a rough surface, in other words, to obtain a crystal of which crystal growth is suppressed at all side surface.

The seed crystal face which contacts with the solvent metal may have a plane index of (1,0,0), (1,1,1) or (1,0,1). However, two or more faces of a crystal may be contacted with the solvent metal. In this case the top face of the crystal is comprised of the same two or more faces to form an edge or edges.

In the present invention the face of the side surface may be controlled by selecting the placing position of sides of the seed crystal with respect to the mutual relationship with the sides of the cross sectional shape of the end of the rodlike solvent metal.

Figure 4:
FIGS. 4, 5 and 6 are top plan views showing the shape of solvent metal used in FIG. 2.

FIG. 2 shows an embodiment of this invention in which one cylindrical diamond single crystal is synthesized. In such a case, a solvent metal 8 which has been formed to a cylindrical shape is used. FIG. 4 is the top plan view of the solvent metal. The diamond forming arrangement is charged into a superhigh pressure and temperature device to pressurise up to a predetermined pressure and to heat it to a predetermined temperature.

The high pressure and the high temperature are held for at least a period of time until the growing diamond crystal reaches the side surface of the solvent metal. That is, the conditions are maintained until the growing diamond crystal reaches the contact surface of the solvent metal with the pressure medium. A cylindrical (rodlike) diamond as shown in FIG. 10 is obtained when the conditions are maintained for a sufficient period of time. The side surface of this cylindrical diamond is rough.

Figure 5:
Figure 6:
Figure 7:
FIGS. 7, 8 and 9 are top plan views showing the shape of solvent metal used in FIG. 3.
Figure 8:
Figure 9:
Figure 10A:
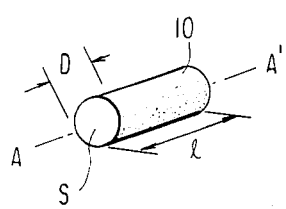
FIGS. 10(a), 10(b), 11, 12 and 13 are schematic illustrations showing examples of rodlike diamonds of this invention.
Figure 11:
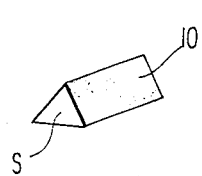
Figure 12:
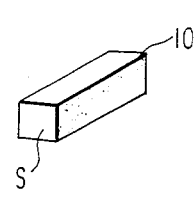
Figure 13:
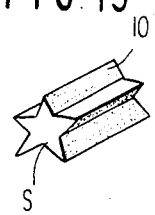

As shown in FIGS. 10, 11, 12 and 13, a rodlike diamond single crystal according to this invention is allotromorphic. It may have an optional cross section such as a circular, triangular, polygonal, or star-shaped cross section. The dotted surfaces 10 in the figures represent the irregular condition on surfaces like ground glass. Rodlike diamonds having a triangular or tetragonal cross section as shown in FIGS. 11 and 12 may be synthesized by the use of solvent metal having a shape as shown in FIGS. 5 and 6. The longitudinal sectional views of these shapes are the same as FIG. 2. FIG. 3 shows the case where a plurality of rodlike diamonds are synthesized at a time. In this case, a solvent metal 9 having a form which has a top plan view as shown in FIGS. 7, 8 or 9 is preferably used.

Figure 10B:

In some cases, the end of the thus obtained crystal does not form a plane surface as shown in FIGS. 10a, 11–13, but forms a convex surface as shown in FIG. 10b.

The diamond single crystal of this invention can be synthesized with the orientation previously selected toward the longitudinal direction (direction of the axis A—A'), so that the necessity for selecting the orientation as mentioned above may be eliminated, and the orientation suited to tools may be easily determined. In addition, it has an advantage that, when attached to a tool support by soldering or sintering, it has an adhesive strength higher than that of natural diamond having comparatively smooth surfaces because of the larger surface area of the diamond of the present invention due to a surface having irregularities like ground glass so that the chances of the diamonds falling off of the tool support during use are greatly reduced.

Figure 16A:
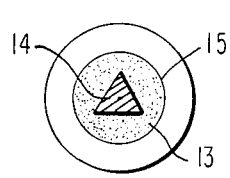
FIGS. 16(a), 16(b) and 17(a), 17(b) are schematic illustrations showing a dresser of this invention; (a) being a top plan view thereof, and (b) a longitudinal sectional view, respectively.
Figure 16B:
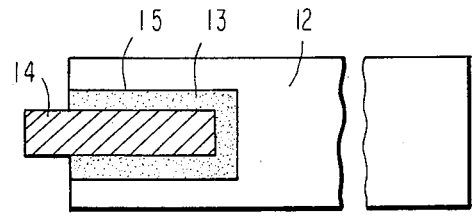
Figure 17A:
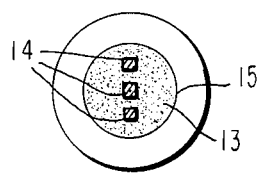
Figure 17B:
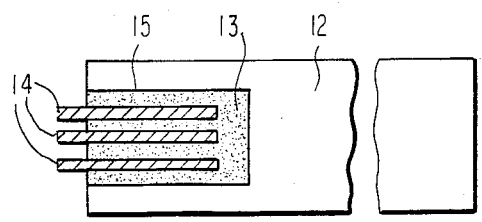

Diamond dressers according to this invention are formed as shown, for example, in FIGS. 16 and 17, by joining an artificial rodlike diamond 14 to a support 12 using a cementing material 13. In joining, an artificial rodlike diamond or diamonds 14 are embedded in a recess 15 provided at the end of the support 12 together with a cementing material 13 such as soldering material, powder sintering material, etc., and joined to the support 12 by heating to 800° to 1000° C. FIG. 16 shows a dresser using a single diamond, and FIG. 17 a dresser using a plurality of diamonds.

Figure 18:
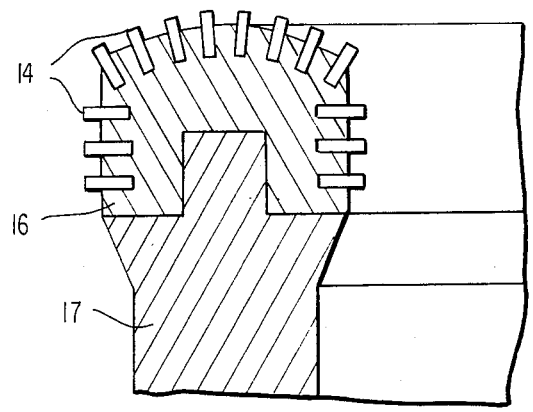
FIG. 18 is a sectional view showing a part of a bit of this invention.

As shown in FIG. 18 a diamond bit according to this invention comprises rodlike synthetic diamonds 14 plated in a ring-shaped sintered matrix 16 being attached to a bit body 17, and joined to the bit body 17 through heat treatment using a soldering material or metal powder. To increase further the adhering strength, the surfaces of said diamonds 14 may be plated with titanium, nickel, etc.

In the dressers and bits according to this invention as mentioned above, the diamonds have a sufficient length preferably such that $l \geq 1.5$ D, and, in the case of polygonal diamonds, have long edges over the length, which permits the diamonds to be used to the last extremity resulting in a reduction in costs.

In addition, since rodlike synthetic diamonds planted project from the tool body, the edges forming knives are always held in a sharp condition even when the wear has progressed to such an extent that only a short portion of the diamonds project beyond the tool body, so that the sharpness of tool will not be reduced.

Furthermore, since diamonds of this invention can be embedded deep enough in tools because of their large length, and since they have an increased adhering strength because of their large surface area due to irregular faces, they are much less likely to fall off the support during use. In addition, metal plating treatment may be easily applied to them because of their rough surfaces. Further, since the orientation of synthetic diamonds is determined at the time of synthesis, it requires no skill to determine the orientation, and it is possible to easily find the orientation in which superior resistance to wear is ensured.

The present invention may be more fully understood from the following examples. However, the scope of the invention is not limited to these examples.

EXAMPLE 1

The diamond forming arrangement as shown in FIG. 2 was used. The seed crystal 1 was a synthetic diamond of 30/40 mesh. As the face in contact with the solvent metal, the face (100) was selected. The solvent metal 8 was an alloy of 58Fe—42Ni which was worked to a shape having a circular leg as shown in FIG. 4. The leg was 2 mm in diameter and 4 mm long, and the top disk was 7 mm in diameter and 1 mm thick. The carbon source 3 was a mixture of 160 mg of graphite powder for spectrochemical analysis and 240 mg of synthetic diamond powder of 325/400 mesh pressed to a disk 7 mm in diameter and 4 mm thick, which was placed on said top disk. These were arranged in a pressure medium 4 of sodium chloride, and a diamond forming arrangement was formed using a cylindrical graphite heater 5 and a pyrophylite pressure medium 6. The arrangement was pressurized up to 54 Kb at which diamond can remain stable using a superhigh pressure and temperature device. The heater 5 was used to hold the temperature at 1420° C. for 20 hours. Releasing temperature and pressure in this order, a cylindrical synthetic diamond 2 mm in diameter and about 3.5 mm long was obtained. The diamond weighed about 30 mg, and was an opaque crystal having irregular outside peripheral surfaces like ground glass. It was found through the identification of the orientation of the crystal using the Laue method that the bottom of the cylinder was (100) as with the seed crystal.

EXAMPLE 2

The solvent metal used was an alloy of Fe-5 Al having a leg with regular triangular cross section with 2 mm sides, as shown in FIG. 5. The face of the seed crystal selected for contact with the solvent metal was the face (111). The arrangement was held under 56 Kb and 1480° C. for 15 hours. The other conditions were the same as in Example 1. A rodlike diamond having a triangular cross section as shown in FIG. 11 was obtained. It was about 3 mm long, and weighed about 15 mg, having opaque and irregular outer surfaces. It was found by means of the Laue method that the bottom of the triangular prism was (111).

EXAMPLE 3

The arrangement as shown in FIG. 3 was used. The solvent metal 9 was pure Ni. Four square legs each of 2 mm sides and 5.5 mm length were formed, and a disk of 7 mm diameter and 1 mm thickness was placed on them as shown in FIG. 9. On the bottom of each leg, a diamond of 30/40 mesh was arranged as the seed crystal 1. Two of them took the face (100) as the seed crystal face, and the others (111). The arrangement was held under 56 Kb and 1400° C. for 25 hours. The other conditions were the same as in Example 1. Four rodlike diamonds having a square cross section as shown in FIG. 12 were obtained. Two of the four were about 5 mm long, and the other two about 3.5 mm long. Each of them weighed about 70 mg or about 50 mg. The identification of the orientation of crystals indicated that the bottom faces of the longer crystals were (100), and those of the shorter ones (111).

EXAMPLE 4

In the same way as in the Example 2, a rodlike diamond of about 100 mg having a triangular cross section was synthesized. The diamond was embedded in the recess 15 having a 6 mm diameter provided in a tool support 12 having a 10 mm diameter together with silver powder as in FIG. 16, and soldered to the support by heating to 900° C. to make a dresser. When used in dressing a SiC grinding wheel, the dresser could be used without losing its sharpness until the portion projecting from the tool support had been worn out.

EXAMPLE 5

In the same way as in the Example 1, rodlike diamonds having a circular cross section were synthesized. Using these, a core bit of 46 mm outside diameter was made as shown in FIG. 18. With this core bit, granite having a compressive strength of about 1500 kg/mm$^2$ was drilled at 250 rpm and at a drilling speed of 5 cm/min. A bit using natural diamonds decreased in drilling speed and wore out when it had drilled a distance of 20 m, while the bit using the rodlike diamonds of this invention wore out when it had drilled a distance of about 28 m, a displaying a performance 1.4 times that of the former.

While the invention has been described in detail and with reference to specific embodiments thereof, it will be apparent to one skilled in the art that various changes and modifications can be made therein without departing from the spirit and scope thereof.

What is claimed is:

1. In a process for manufacturing diamond single crystals, comprising the steps of:
   providing a diamond synthesis reaction system comprised of a reaction chamber housing having positioned therein a carbon source and a solvent metal arranged in contact with the said carbon source:
   providing a seed crystal in the reaction chamber;
   providing temperatures and pressures in the reaction chamber which permit diamond to be maintained thermodynamically stable in the reaction chamber housing;
   heating the reaction chamber to provide a temperature gradient in such a way that a portion of the solvent metal in contact with the carbon surface is higher in temperature than a portion of the solvent metal in contact with the seed crystal so as to migrate the carbon from the higher temperature portion to the lower temperature portion using the solvent metal as a medium; and allowing the carbon to precipitate and grow as a diamond on the seed crystal due to the difference in solubility caused by the temperature gradient in the reaction chamber housing, the crystal growth being maintained until the crystal growth in the reaction chamber housing in at least one direction perpendicular to the direction of the temperature gradient is suppressed at the end of the solvent metal to thereby form a rough surface which diffusibly reflects light on the crystal due to suppressed crystal growth, wherein said temperature provided is from about 1300° to 1600° C. and said pressure provided is from about 50 to 60 Kb, and the crystal growth is maintained from about 10 to 100 hours.

2. A process for manufacturing diamond single crystal as claimed in claim 1, wherein crystal growth is suppressed by using a solvent metal having a shape of the cross section perpendicular to the direction of the temperature gradient such that the crystal growth in the direction of the cross section plane is suppressed by using a solvent metal of insufficient size in this direction.

3. A process for manufacturing diamond single crystals as claimed in claim 1, wherein said solvent metal has a rodlike shape and the crystal growth is conducted until the length of the crystal in the direction of the temperature gradient becomes more than one time the equivalent diameter of the diamond single crystal thereby to form a rodlike crystal.

4. A process for manufacturing diamond single crystals as claimed in claim 2, wherein the cross sectional shape of the solvent metal is the same as that of the diamond single crystal.

5. A process for manufacturing diamond single crystals as claimed in claim 2, wherein the equivalent diameter of the cross section of the solvent metal is not more than 4 mm and the crystal grows at a rate of not more than 5 mg/H.

6. A process for manufacturing diamond single crystals as claimed in claim 1, wherein the solvent metal has a rodlike shape and has a plate of the metal having a larger cross section area than the rodlike solvent metal, the plate being provided at the end of the rodlike solvent metal contacting with the carbon source.

7. A process for manufacturing diamond single crystals as claimed in claim 6, wherein the solvent metal is comprised of a plurality of the rodlike metal which are joined to the solvent metal plate.

8. A process for manufacturing diamond single crystals as claimed in claim 2, wherein the equivalent diameter of the cross section of the solvent metal is not more than 3 mm and the crystal grows at a rate of 1 to 3 mg/H.

9. A process for manufacturing diamond single crystals as claimed in claim 2, wherein the equivalent diameter of the cross section of the solvent metal is not more than 4 mm and the crystal grows at a rate of more than 3 and up to 5 mg/H.

10. A process for manufacturing diamond single crystals as claimed in claim 2, wherein the solvent metal is a metal selected from the group consisting of Fe, Ni, Co, and alloys thereof.

11. A process for manufacturing diamond single crystals as claimed in claim 2, wherein the temperature difference between the seed crystal portion and the carbon source is in the range of about 10° C. to 50° C.

* * * * *